(12) United States Patent  
Huang et al.

(10) Patent No.: US 6,685,503 B1
(45) Date of Patent: Feb. 3, 2004

(54) AC ADAPTER MOUNTING STRUCTURE (75) Inventors: James Huang, Taipei (TW); Tin Chang, Ping Jen (TW)

(73) Assignee: Lite-On Enclosure Inc., Taipei (TW)

( * ) Notice: Subject to any disclaimer, the term of this patent is extended or adjusted under 35 U.S.C. 154(b) by 0 days.

(21) Appl. No.: 10/329,516

(22) Filed: Dec. 27, 2002

(51) Int. Cl.⁷ .............................................. A01R 13/60
(52) U.S. Cl. ...................................... 439/527; 361/727
(58) Field of Search ................................ 361/600, 601, 361/622, 679, 625, 728, 729, 730, 731, 732, 724, 725, 726, 727, 755, 756, 683; 439/527, 376, 341, 534, 535

(56) References Cited

U.S. PATENT DOCUMENTS

| | | | |
|---|---|---|---|
| 5,172,305 A | * 12/1992 | DeWilde | 361/796 |
| 5,584,396 A | * 12/1996 | Schmitt | 211/26 |
| 5,587,881 A | * 12/1996 | Wang | 361/695 |
| 5,612,854 A | * 3/1997 | Wiscombe et al. | 361/727 |
| 5,745,342 A | * 4/1998 | Jeffries et al. | 361/683 |
| 5,777,848 A | * 7/1998 | McAnally et al. | 361/725 |
| 5,790,372 A | * 8/1998 | Dewey et al. | 361/683 |
| 6,215,664 B1 | * 4/2001 | Hernandez et al. | 361/725 |
| 6,229,696 B1 | * 5/2001 | Lin et al. | 361/683 |
| 6,246,571 B1 | * 6/2001 | Lin et al. | 361/683 |
| 6,270,046 B1 | * 8/2001 | Liu et al. | 248/231.9 |
| 6,272,008 B1 | * 8/2001 | Huang | 361/683 |
| 6,272,009 B1 | * 8/2001 | Buican et al. | 361/683 |
| 6,288,901 B1 | * 9/2001 | Liu et al. | 361/724 |
| 6,386,656 B1 | * 5/2002 | Chen | 312/223.2 |
| 6,530,551 B2 | * 3/2003 | Gan | 248/694 |
| 6,538,879 B2 | * 3/2003 | Jiang | 361/683 |
| 6,577,501 B2 | * 6/2003 | Lin | 361/686 |

* cited by examiner

Primary Examiner—Ross Gushi
(74) Attorney, Agent, or Firm—Browdy and Neimark, P.L.L.C.

(57) ABSTRACT

An AC adapter mounting structure is constructed to include a housing holding a rack. The housing has two vertical pivot rods and two locating holes symmetrically disposed in top and bottom sides of a side opening thereof, and an AC adapter for positioning in the rack inside the housing. The AC adapter has two pivots respectively pivoted in the pivot holes, two short positioning rods for engaging the locating holes of the housing after the pivots are pivoted in the pivot holes and the AC adapter is turned to the inside of the housing, and two stop blocks, which are forced into engagement with respective retaining holes in the rack when the AC adapter is set into the inside of the housing.

4 Claims, 8 Drawing Sheets

AC ADAPTER MOUNTING STRUCTURE

BACKGROUND OF THE INVENTION

1. Field of the Invention

The present invention relates to the installation of an AC adapter in the housing of a computer and, more particularly, to an AC adapter mounting structure, which enables the AC adapter to be quickly installed in the housing of a computer without the use of screws.

2. Description of the Related Art

Figure 1:
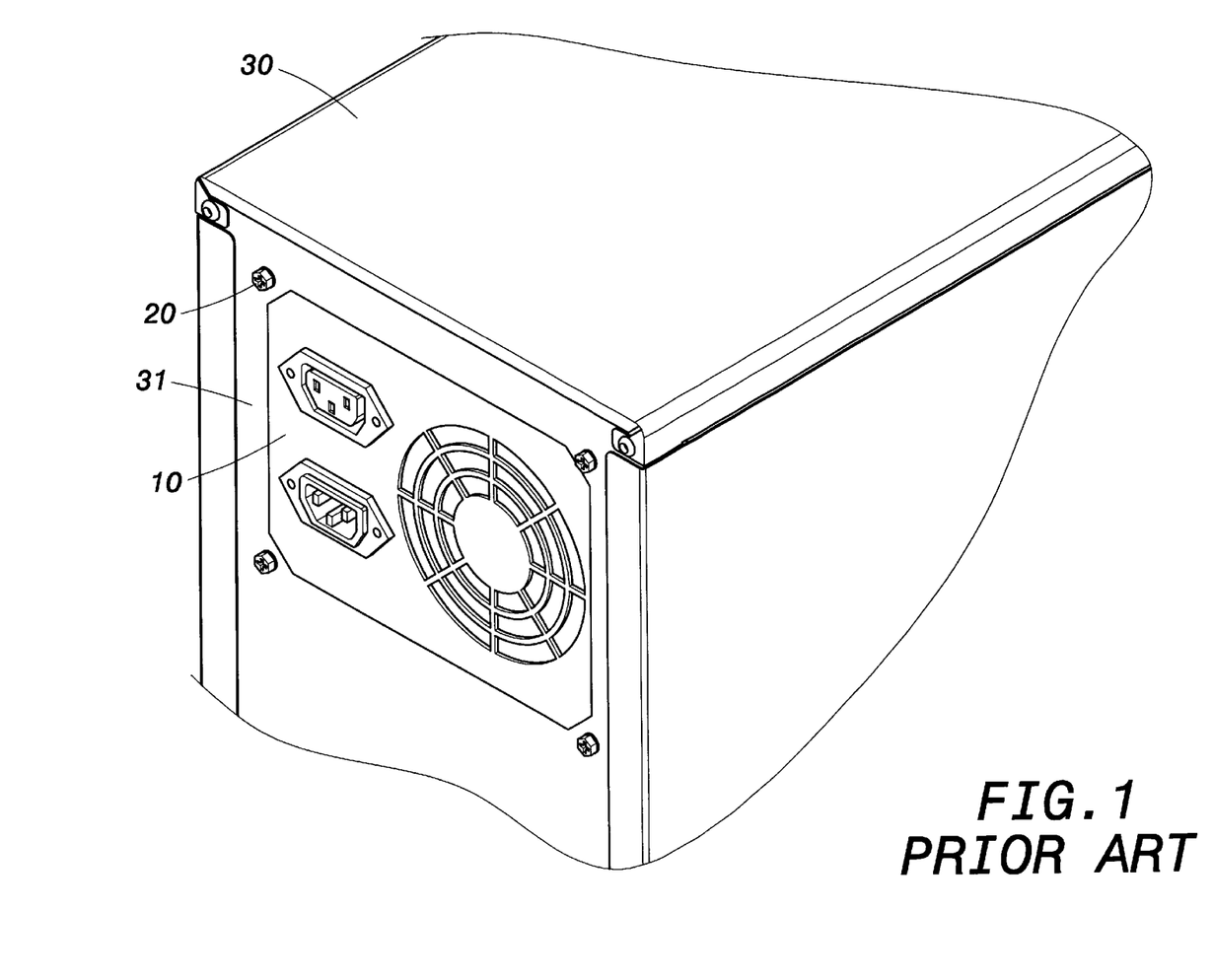
FIG. 1 is a schematic elevational view showing an AC adapter installed in the housing of a computer according to the prior art.

FIG. 1 illustrates an AC adapter installed in the housing of a computer according to the prior art. As illustrated, the AC adapter 10' is fastened to the back panel 31' of the housing 30' with screws 20'. During installation, the operator must hold the AC adapter 10' with one hand, keeping the respective screw holes (not shown) of the AC adapter 10' aligned with the respective screw holes (not shown) in the back panel 31' of the housing 30', and then operate a screwdriver with the other hand to drive respective screws 20' into the screw holes of the back panel 31' of the housing 30' and the screw holes in the AC adapter 10'. This installation procedure is complicated.

SUMMARY OF THE INVENTION

The present invention is directed to provision of an AC adapter mounting structure, which eliminates the aforesaid problem. It is therefore the main object of the present invention to provide an AC adapter mounting structure, which enables the AC adapter to be quickly installed in the housing of a computer without the use of screws. It is another object of the present invention to provide an AC adapter mounting structure, which enables the AC adapter to be quickly and positively set into position through a rotary motion without the use of screws. To achieve these and other objects of the present invention, the AC adapter mounting structure comprises an AC adapter, the AC adapter comprising a front panel fixedly fastened thereby with screws. A left panel, and a right panel, the front panel of the AC adapter have a locating slot and a positioning slot at two sides. Two mounting flanges extend perpendicularly backward from top and bottom sides thereof. Two pivots are respectively located on the mounting flanges on the middle and are vertically aligned in a line. Two short positioning rods are respectively located on the mounting flanges. The left panel of the AC adapter has two vertically spaced stop blocks. The right panel of the AC adapter has a rear mounting lug, a front mounting lug, and a locating hole spaced above the front mounting. The left panel of the AC adapter has at least one stop block. The AC adapter mounting structure further comprises a housing adapted to receive the AC adapter, the housing comprising a back panel, a top panel, and a side panel. The back panel of the housing has an opening through which the AC adapter is inserted into the inside of the housing, two vertically spaced pivot holes respectively coupled to the pivots of the AC adapter for enabling the AC adapter to be turned into the inside of the housing and set into position, and two vertically spaced locating holes adapted to receive the short positioning rods of the AC adapter after the pivots of the AC adapter have been pivoted to the pivot holes and the AC adapter has been turned to the inside of the housing. The top panel of the housing has a locating slot adapted to receive the rear mounting lug of the right panel of the AC adapter. The AC adapter mounting structure further comprises a rack fixedly fastened to the back panel of the housing and adapted to hold the AC adapter inside the housing, the rack having an upright sidewall and a horizontal bottom wall. The bottom wall of the rack has a downward flange at an outer side thereof and a locating slot formed in the downward flange and adapted to receive the front mounting lug of the right panel of the AC adapter. The upright sidewall has two retaining holes adapted to receive the stop blocks of the left panel of the AC adapter.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENT

Figure 2:
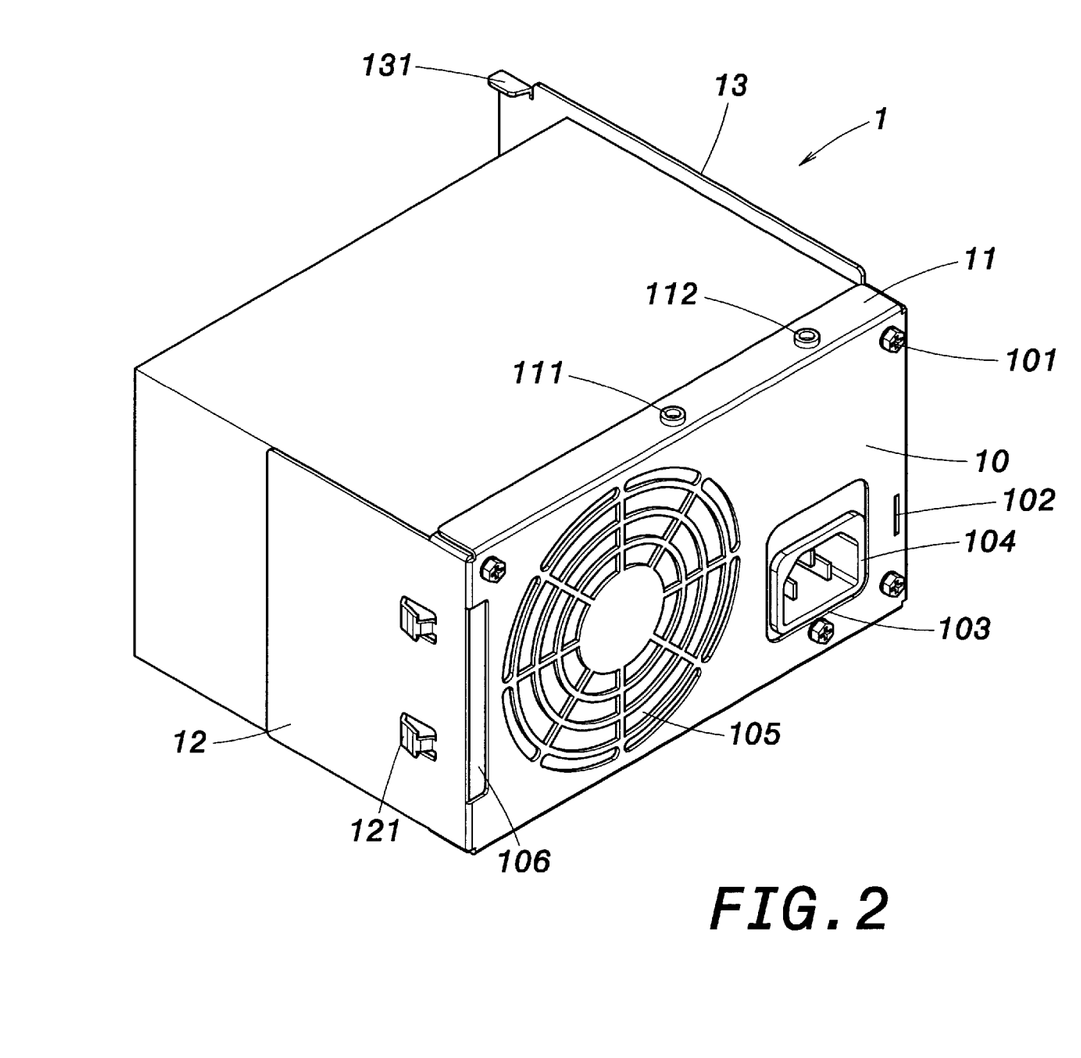
FIG. 2 is a schematic elevational view of an AC adapter constructed according to the present invention.

Referring to FIG. 2, the AC adapter, referenced by 1, has a front panel 10 fixedly secured thereto by screws 101, a left panel 12 perpendicularly backwardly extending from the left side of the front panel 10, and a right panel 13 perpendicularly backwardly extended from the right side of the front panel 10. The front panel 10 has a socket hole 103, which holds a socket 104, air vents 105 for the passing of hot air from the inside of the AC adapter to the outside open air, a locating slot 102 near the right side, a positioning slot 106 near the left side, two mounting flanges 11 perpendicularly backwardly extending from the top and bottom sides, two pivots 111 respectively located on the mounting flanges 11 on the middle and vertically aligned in a line, and two short positioning rods 112 respectively located on the mounting flanges 11. The left panel 12 has two vertically spaced stop blocks 121 formed of a part thereof by stamping. The right panel 13 has a rear mounting lug 131 protruding from the distal (free) end at the top, a front mounting lug 132 protruding from the bottom side near the front panel 10, and a locating hole 133 spaced above the front mounting lug 132 near the top.

Figure 3:
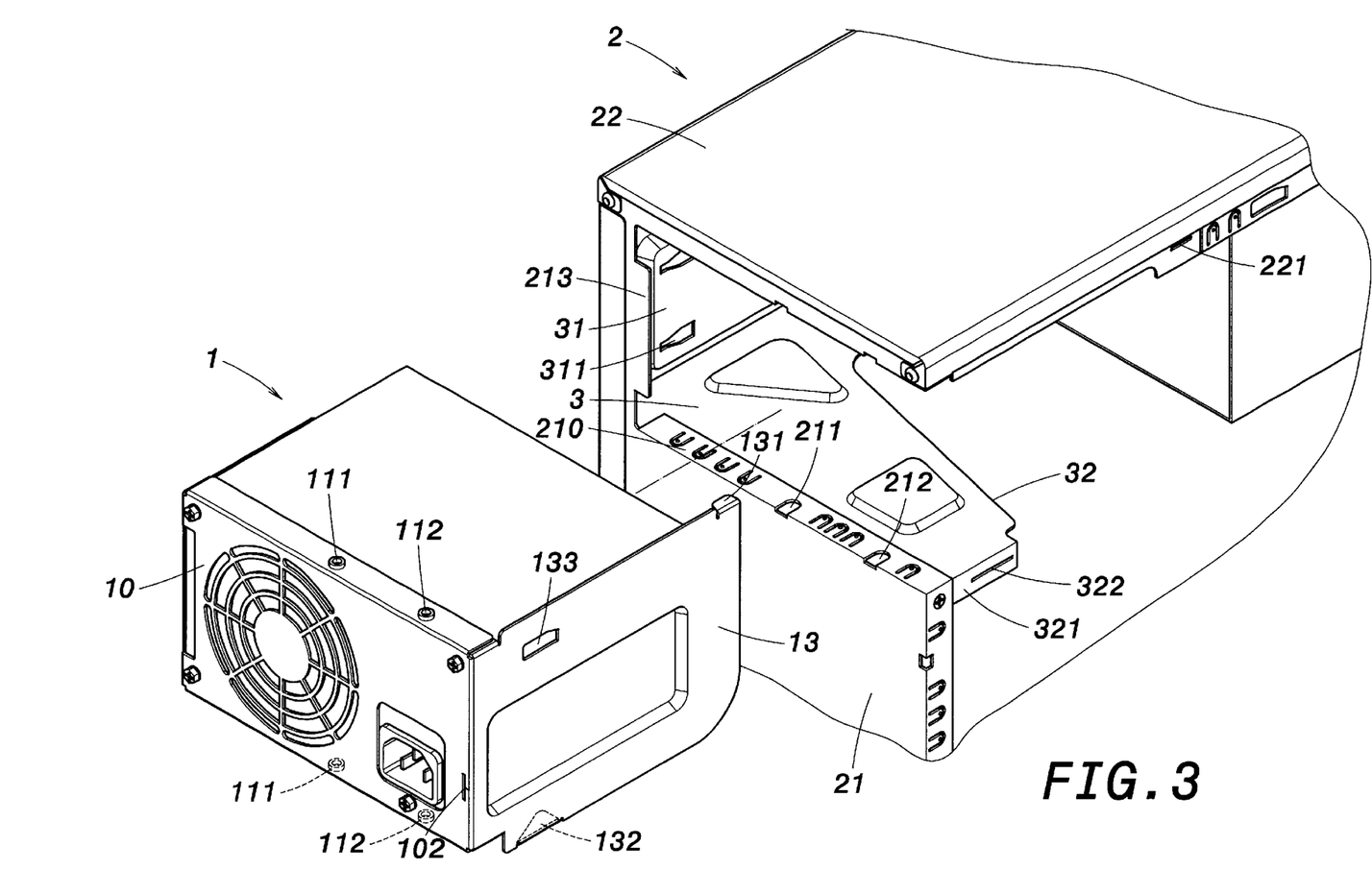
FIG. 3 is a schematic exploded view of the AC adapter mounting structure according to the present invention.
Figure 8:
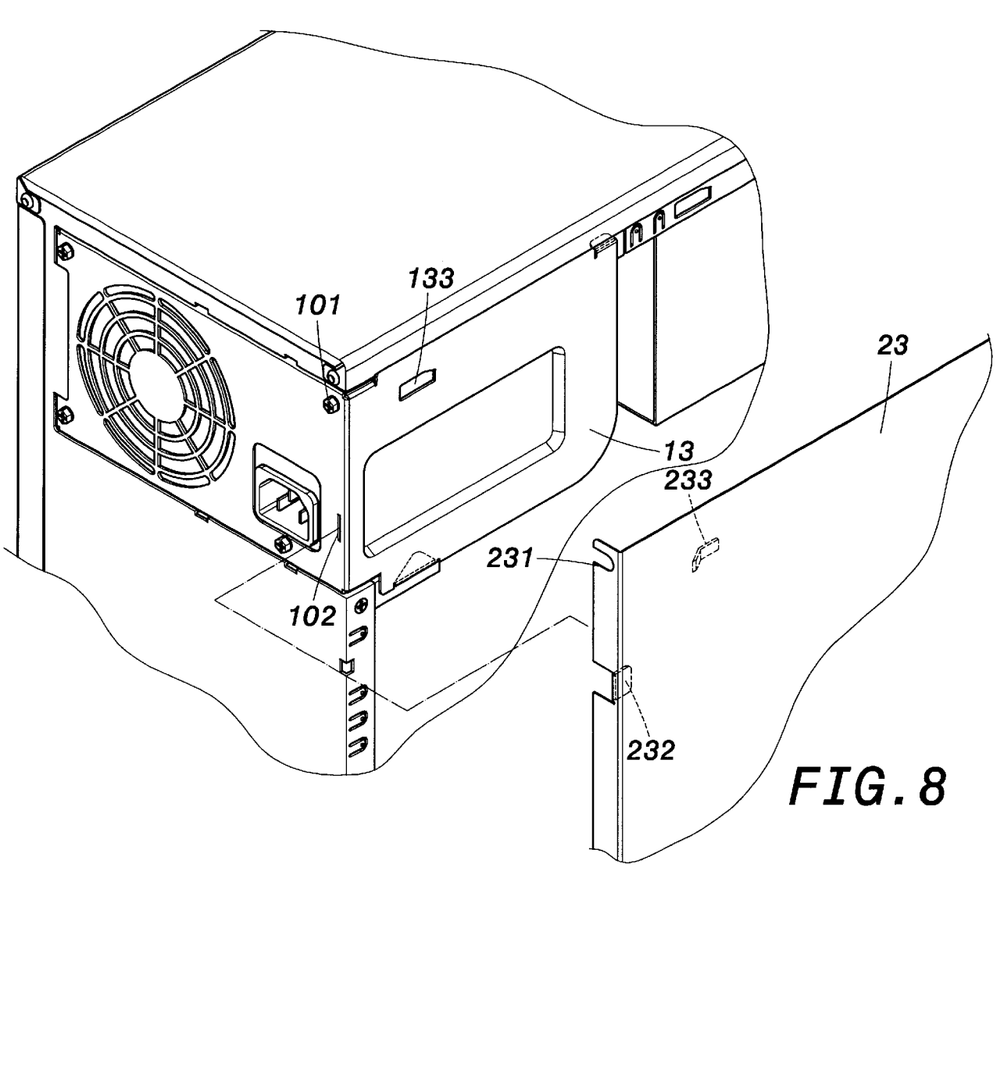
FIG. 8 is a schematic perspective view of the present invention before installation of the side panel of the housing.

Referring to FIGS. 3 and 8, the housing 2 for computer mainframe comprises at least a back panel 21, a top panel 22, a side panel 23, and a rack 3. The rack 3 is fixedly fastened to the back panel 21, and adapted to hold the AC adapter 1 on the inside of the housing 2. The back panel 21 has an opening 210 through which the AC adapter 1 is set in the rack 3, two pivot holes 211 respectively provided in the top and bottom sides of the opening 210 corresponding to the pivots 111 of the AC adapter 1, two locating holes 212 respectively provided in the top and bottom sides of the opening 210 corresponding to the short positioning rods 112 of the AC adapter 1, and a stop flange 213 suspended in one lateral side of the opening 210 corresponding to the positioning slot 106 of the AC adapter 1. The top panel 22 has a locating slot 221 corresponding to the rear mounting lug 131 of the AC adapter 1. The rack 3 has at least one upright sidewall 31 and a horizontal bottom wall 32. The bottom wall 32 has a downward flange 321 at an outer side and a locating slot 322 formed in the downward flange 321 corresponding to the front mounting lug 132. The upright sidewall 31 has two vertically spaced retaining holes 311.

Figure 4:
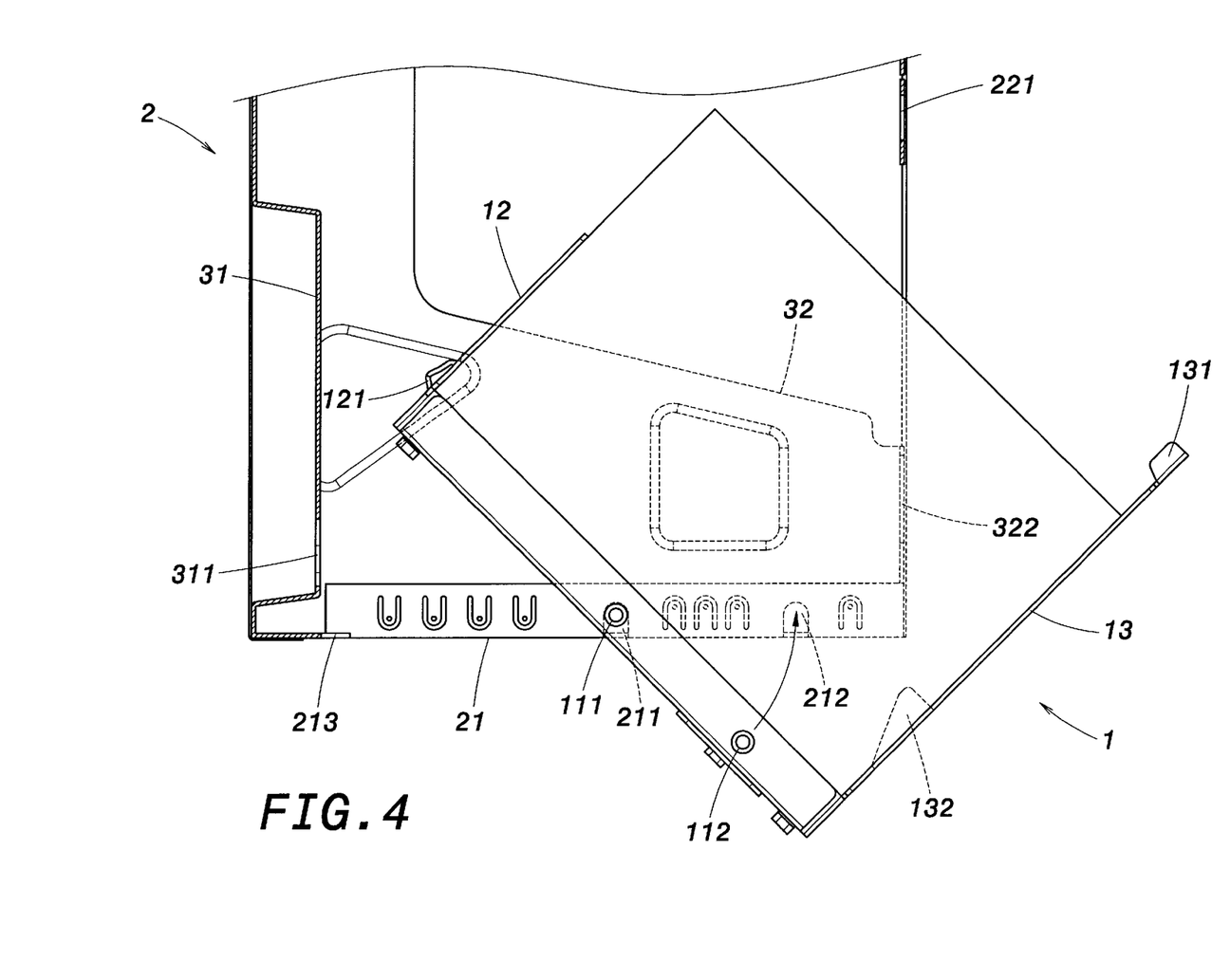
FIG. 4 is a schematic, perspective top view of the installation of the AC adapter in the housing according to the present invention.
Figure 5:
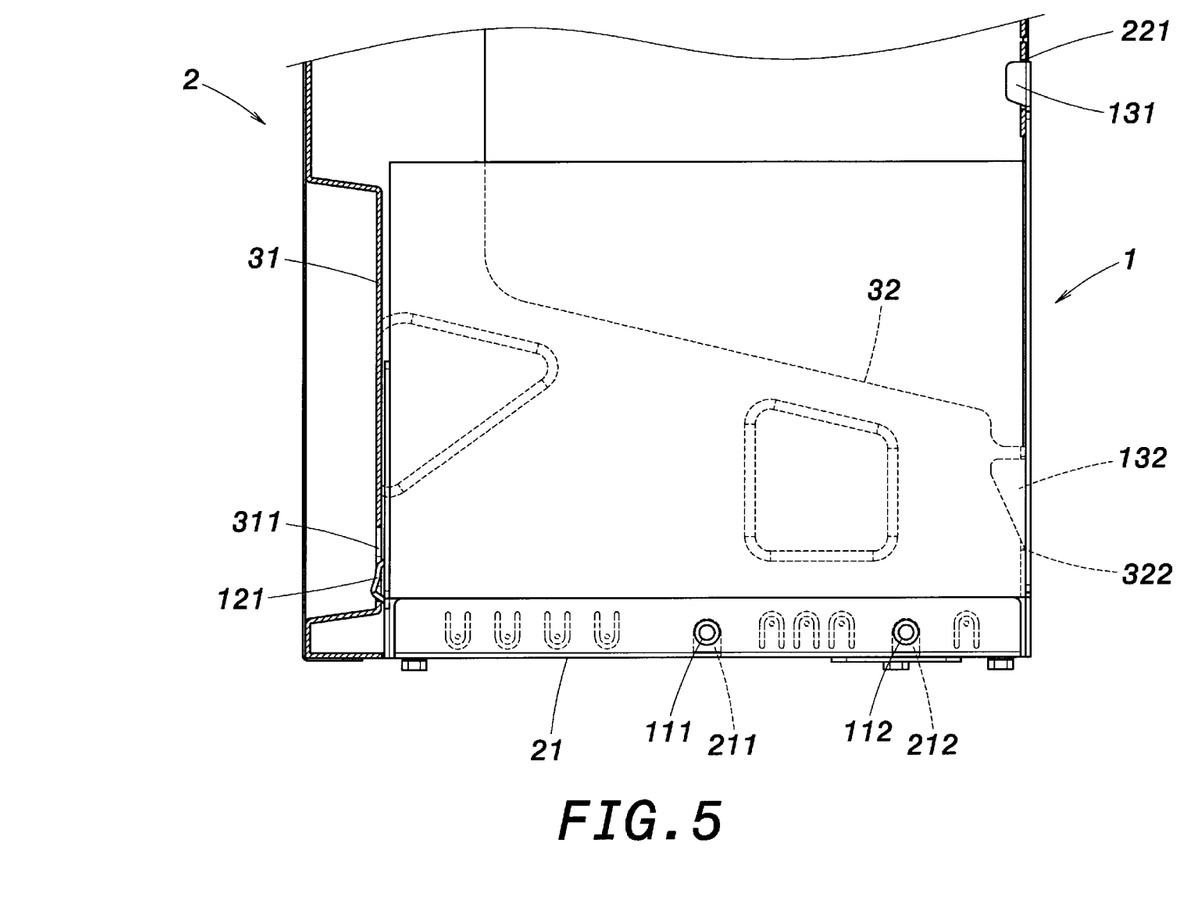
FIG. 5 is a schematic, perspective top view after installation of the AC adapter in the housing according to the present invention.

Referring to FIGS. 4 and 5, the AC adapter 1 is inserted through the opening 210 in the back panel 21 of the housing 2 into the rack 3, for enabling the pivots 111 to be respectively coupled to the pivot holes 211, and then the AC adapter 1 is turned about the axis passing through the pivot holes 211 counter-clockwise to force the short positioning rods 112 into the locating holes 212 to stop the AC adapter 1 from displacement in transverse direction. At the same time, the mounting lugs 131 and 132 of the AC adapter 1 are respectively engaged into the locating slot 221 of the top panel 22 of the housing 2 and the locating slot 322 of the rack 3 to prevent longitudinal displacement of the AC adapter, and the retaining holes 311 of the rack 3 are respectively forced into engagement with the stop blocks 121 of the AC adapter 1 to reinforce the positioning of the AC adapter 1 in the rack 3. When installed, the stop flange 213 of the housing 2 is engaged in the positioning slot 106 of the AC adapter 1 to hold down the AC adapter 1 in position.

Figure 6:
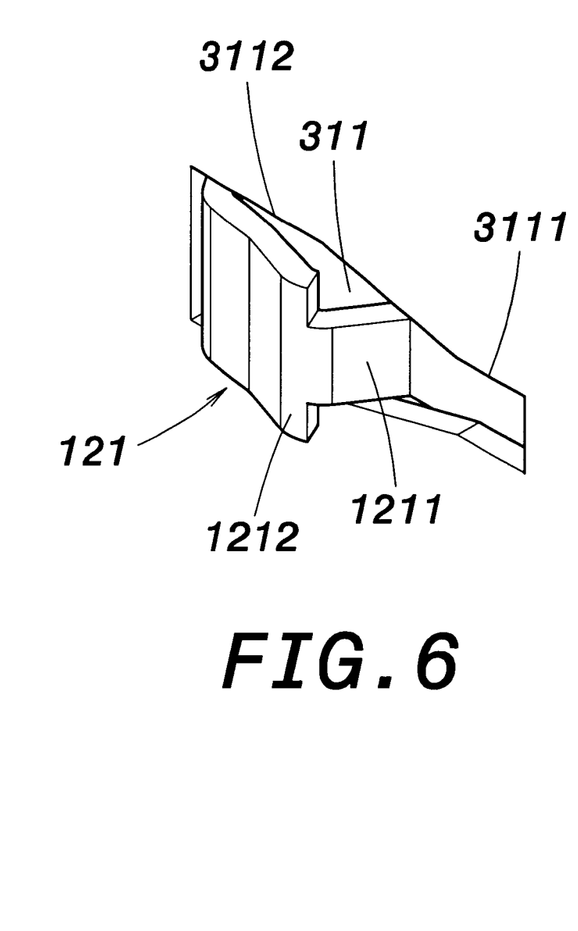
FIG. 6 is a schematic, enlarged view of a part of the present invention, showing one stop block of the AC adapter inserted into the corresponding retaining hole of the rack.
Figure 7:
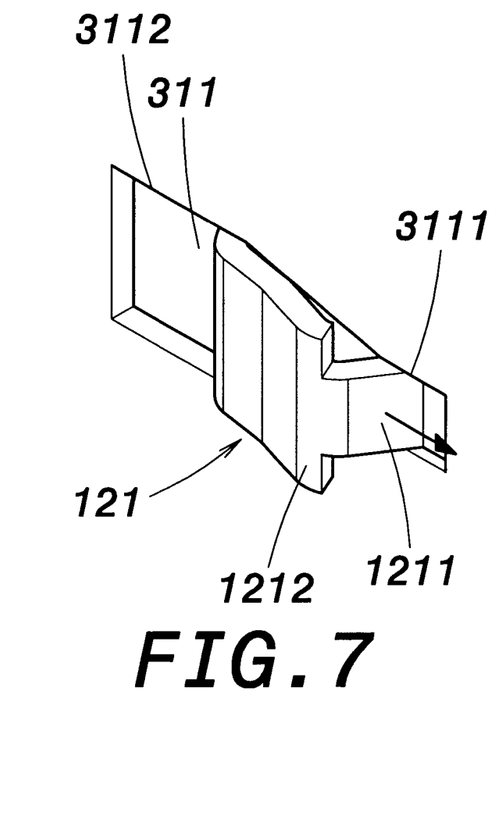
FIG. 7 is similar to FIG. 6 but shows the expanded head of the stop block stopped at the narrow rear portion of the retaining hole.

Referring to FIGS. 6 and 7, the stop block 121 is a substantially V-shaped protruding member formed of a part of the metal left panel 12 of the AC adapter 1 by stamping, having an expanded head 1212 and a narrow neck 1211 connected between one end of the head 1212 and a part of the left panel 12 (see also FIG. 2). The retaining hole 311 has an expanded front portion 3112 and a narrow rear portion 3111. During installation, the stop block 121 is inserted through the expanded front portion 3112 of the retaining hole 311, and then pulled sideways toward the narrow rear portion 3111 of the retaining hole 311, keeping the expanded head 1212 stopped at the narrow rear portion 3111 of the retaining hole 311.

Figure 9:
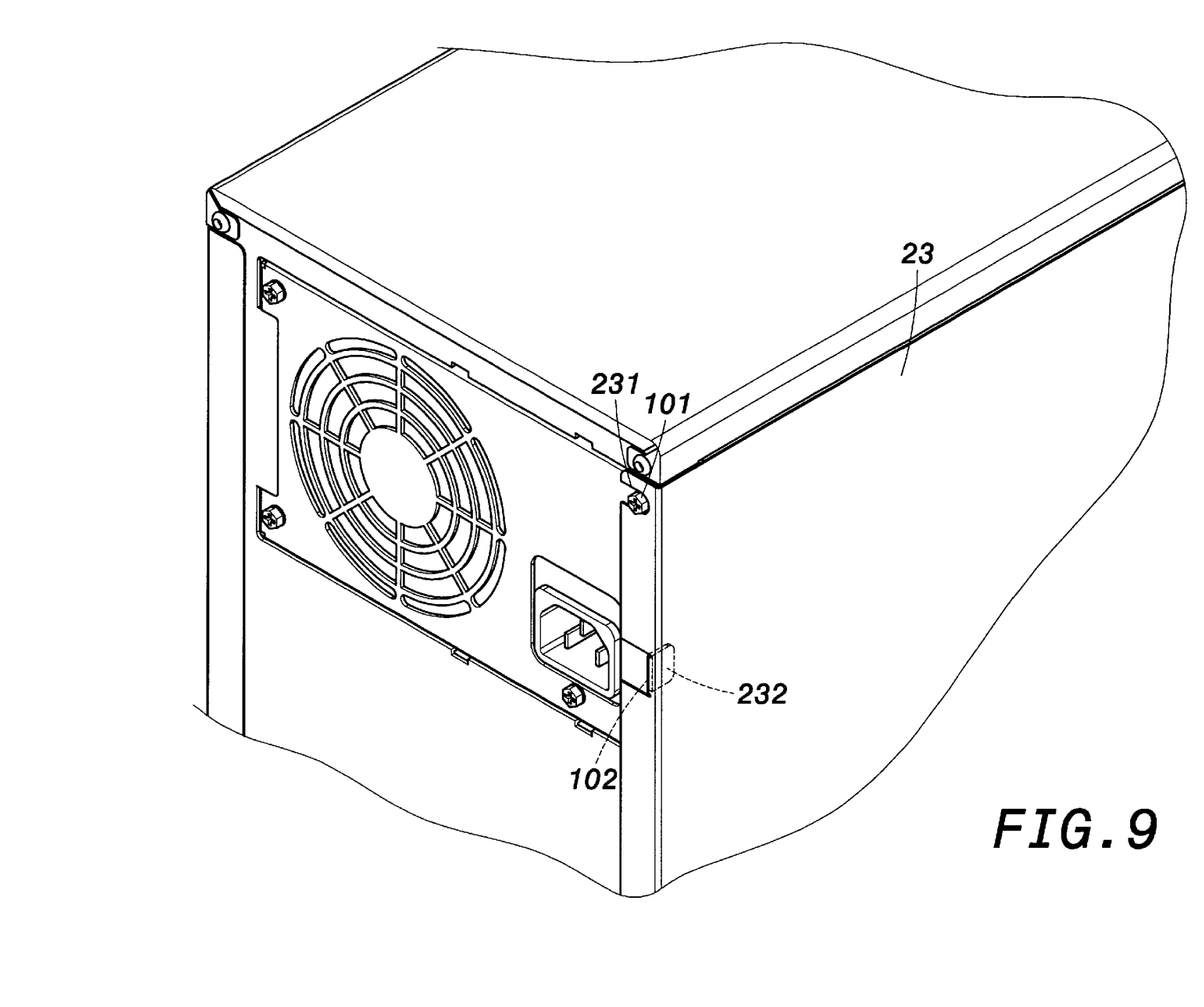
FIG. 9 is similar to FIG. 8 but shows the side panel of the housing installed.

Referring to FIGS. 8 and 9, the side panel 23 of the housing 2 has a locating notch 231, a lug 232, and a hook 233. When the side panel 23 is attached to the top panel 22 and back panel 21 of the housing 2, the locating notch 231 is forced into engagement with one screw 101 in the front panel 10 of the AC adapter 1, the lug 232 is engaged in the locating slot 102 of the front panel 10 of the AC adapter 1, and the hook 233 is hooked in the locating hole 133 of the right panel 13 of the AC adapter 1.

A prototype of screw-free AC adapter mounting structure has been constructed with the features of the annexed drawings of FIGS. 2–9. The screw-free AC adapter mounting structure functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An AC adapter mounting structure comprising:
   an AC adapter, said AC adapter comprising a front panel fixedly fastened thereto with screws, a left panel, and a right panel, the front panel of said AC adapter having a locating slot and a positioning slot in two sides, two mounting flanges perpendicularly backwardly extending from top and bottom sides thereof, two pivots respectively located on said mounting flanges in the middle and vertically aligned in a line, and two short positioning rods respectively located on said mounting flanges, the left panel of said AC adapter having at least one stop block, the right panel of said AC adapter having a rear mounting lug, a front mounting lug, and a locating hole spaced above said front mounting, and the left panel of said AC adapter having at least one stop block;
   a housing adapted to receive said AC adapter, said housing comprising a back panel, a top panel, and a side panel, the back panel of said housing having an opening wherethrough said AC adapter is inserted into the inside of said housing, two vertically spaced pivot holes respectively coupled to the pivots of said AC adapter for enabling said AC adapter to be turned to the inside of said housing and set into position, and two vertically spaced locating holes adapted to receive the short positioning rods of said AC adapter after the pivots of said AC adapter have been pivoted to said pivot holes and said AC adapter is been turned to the inside of said housing, the top panel of said housing having a locating slot adapted to receive the rear mounting lug of the right panel of said AC adapter; and
   a rack fixedly fastened to the back panel of said housing and adapted to hold said AC adapter inside said housing, said rack having an upright sidewall and a horizontal bottom wall, the bottom wall of said rack having a downward flange at an outer side thereof and a locating slot formed in said downward flange and adapted to receive the front mounting lug of the right panel of said AC adapter, said upright sidewall having at least one retaining hole adapted to receive the at least one stop block of the left panel of said AC adapter.

2. The AC adapter mounting structure as claimed in claim 1 wherein the side panel of said housing has a locating notch forced into engagement with one screw in the front panel of said AC adapter, a lug engaged into the locating slot of the front panel of said AC adapter, and a hook hooked in the locating hole of the right panel of said AC adapter.

3. The AC adapter mounting structure as claimed in claim 1 wherein said rack has a stop flange forced into engagement with the positioning slot of the front panel of said AC adapter to hold down said AC adapter in said rack.

4. The AC adapter mounting structure as claimed in claim 1 wherein said at least one stop block of said AC adapter each has an expanded head and a narrow neck connected between said expanded head and the left panel of said AC adapter, wherein each retaining hole of said rack each has an expanded rear portion for passing through one stop block of said AC adapter, and a narrow front portion for the passing through the narrow neck of the corresponding stop block of said AC adapter and for stopping backward movement of the expanded head of the corresponding stop block of said AC adapter.

* * * * *